(12) United States Patent
White et al.

(10) Patent No.: US 10,120,055 B2
(45) Date of Patent: Nov. 6, 2018

(54) ISOLATED CAPACITANCE LINE VOLTAGE SENSOR

(71) Applicant: Siemens Industry, Inc., Alpharetta, GA (US)

(72) Inventors: Joe White, Austin, TX (US); Robert C. Bartmess, Austin, TX (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 212 days.

(21) Appl. No.: 14/471,869

(22) Filed: Aug. 28, 2014

(65) Prior Publication Data
US 2016/0061864 A1    Mar. 3, 2016

(51) Int. Cl.
*G01R 35/00* (2006.01)
*G01R 15/16* (2006.01)

(52) U.S. Cl.
CPC .......... *G01R 35/005* (2013.01); *G01R 15/16* (2013.01)

(58) Field of Classification Search
CPC ........ G01R 15/146; G01R 1/30; G01R 29/24; G01R 19/2513; G01R 21/00; G01R 27/2617; H01L 23/5222; H01L 23/5226; H01L 23/53295
USPC .... 324/600, 551, 601, 239, 76.11, 127, 539, 324/713, 74, 628–680; 174/103, 110 R, 174/115, 126.1, 24, 74 R; 340/533, 340/568.3; 455/67.11; 345/173–175
See application file for complete search history.

(56) References Cited

U.S. PATENT DOCUMENTS

| | | | | | |
|---|---|---|---|---|---|
| 5,473,244 | A | * | 12/1995 | Libove | G01R 1/22 324/126 |
| 5,892,430 | A | * | 4/1999 | Wiesman | G01R 1/30 324/126 |
| 6,677,743 | B1 | * | 1/2004 | Coolidge | G01R 15/16 324/126 |
| 2002/0171433 | A1 | * | 11/2002 | Watanabe | G01R 15/16 324/539 |
| 2005/0275397 | A1 | * | 12/2005 | Lightbody | G01R 15/142 324/126 |

(Continued)

FOREIGN PATENT DOCUMENTS

EP    2763259 A1    8/2014

OTHER PUBLICATIONS

PCT Search Report dated Oct. 14, 2015, for PCT Application PCT/US2015/043520, 14 pages.

(Continued)

*Primary Examiner* — Melissa Koval
*Assistant Examiner* — Nasima Monsur

(57) ABSTRACT

Isolated capacitance line voltage sensing is provided that avoids metal-to-metal contact for voltage sensing of a power signal present on a power wire. An external conductor is positioned by the power wire, creating a capacitor with the power wire conductor, insulation, and external conductor. The capacitance is used to measure the electric field, indicating a voltage level for the powered wire. The impedance mismatch caused by the capacitance is transformed. The impedance transformation circuit may be integrated with the external conductor, allowing voltage sensing by a voltage meter having a lower input impedance. A manual or automatic calibration circuit may be provided to ensure the measured voltage represents the actual voltage on the power wire.

19 Claims, 2 Drawing Sheets

(56) References Cited

U.S. PATENT DOCUMENTS

2009/0256578 A1* 10/2009 Wuerstlein ........... G01D 5/2405
324/601
2012/0200293 A1* 8/2012 Carpenter ................ G01R 1/22
324/252
2012/0319675 A1* 12/2012 El-Essawy ............. G01R 35/02
324/74
2014/0088562 A1 3/2014 Barbut et al.

OTHER PUBLICATIONS

H. C. Ross, Voltage Sensing, Measurement & Phasing, Ross Engineering Corp., Abstract, http//www.rossengineeringcorp.com/products/measurement/hi-z-hv-volt, pp. 1-7, 2014.

Young, W.A., "An Overview of Lapp Insulator High Voltage Bushing Design", Lapp Insulator Company, LeRoy, NY 14482, USA, downloaded from internet, www.hubbellpowersystems.com/.../bushings/PCO-10techpaper_overview.pdf.

Doble Engineering Diagnostics Toolbox, Introduction to Doble Bushings Testing, downloaded from internet www.doble.com/.../Section6_2-DTT_PT1_Bushings_Testing.pdf.

* cited by examiner

ISOLATED CAPACITANCE LINE VOLTAGE SENSOR

TECHNICAL FIELD

This patent document generally relates to voltage sensing and connecting a voltage sensor to a wire while powered.

BACKGROUND

For demand response, metering, frequency monitoring, fault detection, and/or power quality measurements, the voltage and current of a wire are detected. For example, energy and power information is used to optimize energy costs. As another example, energy and power information is used in demand response scenarios to support aggregated demand response functionality.

For current measurement of a powered wire (e.g., "hot" mains power into a facility), the magnetic field is measured by a current transformer. The sensor is simply placed around the wire. Placing the sensors for performing the voltage measurements may be more difficult. For voltage measurement of the powered wire, a metal-to-metal or physical connection of the voltage meter feed to the wire is created using a bare wire, ring lug connector, wire nuts, or a screw down. Since the wire is powered during the connection, the installer must be careful. In some situations, the measurements are temporary, such as for analysis. Removing sensors after the analysis incurs a cost.

SUMMARY

The disclosed system, apparatus, and method for isolated capacitance line voltage sensing may avoid metal-to-metal contact for voltage sensing. An external conductor is positioned by or in close proximity (within 1 mm) of the powered wire, creating a capacitor with the elements of the capacitor being the wire conductor, insulation, and external conductor. The reactance of the capacitor is the basis for measuring the voltage on the wire with a measuring circuit. At 60 Hz, the reactance of the capacitor, which is in the range or 10 to 100 pf, is high. To effect an impedance match between the equivalent impedance and the impedance of the measuring circuit, an impedance transformation circuit is used. The impedance transformation circuit may be integrated with the external conductor or as a separate device, allowing voltage sensing by a measuring circuit (voltage meter) having a lower input impedance.

In one embodiment, a method is provided for isolated capacitance line voltage sensing. A conductor is placed against electrical insulation material of a power wire while power is supplied in the power wire. The power wire is in an existing installation previously used for supplying the power and connected with a disconnect panel. The conductor is clamped against the electrical insulation. A voltage is measured as a function of a capacitance between the conductor and the power wire.

In another embodiment, a system is provided for isolated capacitance line voltage sensing. A sleeve is sized to wrap around at least part of an insulated wire. A conductive area is on the sleeve. An impedance transform circuit connects with the conductive area and is on the sleeve. An AC signal output is provided by the impedance transform circuit.

In yet another embodiment, an apparatus is provided for isolated capacitance line voltage sensing. A wrap is configured to rest against insulation of a power conductor. A capacitor plate is on or in the wrap. The capacitor plate is configured to form a capacitor with the power conductor and intervening insulation of the power conductor. An impedance transformation circuit is on or in the wrap. The impedance transformation circuit connects with the capacitor plate and has an output configured for line voltage sensing.

Other embodiments, configurations, modifications and variations of these summarized concepts are disclosed, and each of the disclosed embodiments can be used alone or together in combination. Additional features and advantages of the disclosed embodiments are described in, and will be apparent from, the following Detailed Description and the figures.

DETAILED DESCRIPTION

A flexible conductive membrane in the form of a sleeve similar to or formed with a flexible circuit board wraps more or less around an insulated conductor to capacitively couple with the line voltage. Additionally, an impedance transformation element or elements (e.g., one or more field effect transistors (FETs)) are integrated on the membrane or attached to the membrane. The impedance transformation element is capable of driving the traditional signal processing and ADC functions of a voltage sensor. The arrangement may be calibrated for a given application.

The proposed approach would not require physical connection to an electrically hot conductor but would rely on application of the sleeve type of device, which would provide capacitive coupling through the feed insulation to the voltage carrying conductor. The sleeve is clamped or attached with adhesive to the conductor to form the capacitive coupling. The installation is similar to that used for current measurement, which relies on a split core current transformer that surrounds the conductor and senses the magnetic field surrounding the conductor. Instead of using the magnetic field to measure current as in the case of a current transformer, the voltage is sensed using the electric field and the capacitive coupling sleeve. The impedance transformation is integrated or attached to the sleeve, making a complete transducer function for connecting with a voltage meter.

Like installing a current transformer for current sensing, no physical connection to the 'hot' metallic conductor is needed to sense voltage. Not having to make a physical high voltage connection (e.g., typically connecting to each of three phases) may provide a safety advantage or eliminate the need to shutdown power to a building. The installation may be quicker and lower cost. Both voltage and current may be measured in a conductor without making a physical connection to the conductor. Power and energy consumption for demand response or metering, frequency for frequency monitoring, or presence or absence of power in a power loss sensor may be provided without metal-to-metal contact. Metering, sub-metering, frequency monitoring, fault (e.g., loss of power) detection, power quality monitoring, or other voltage sensing may benefit.

Figure 1:
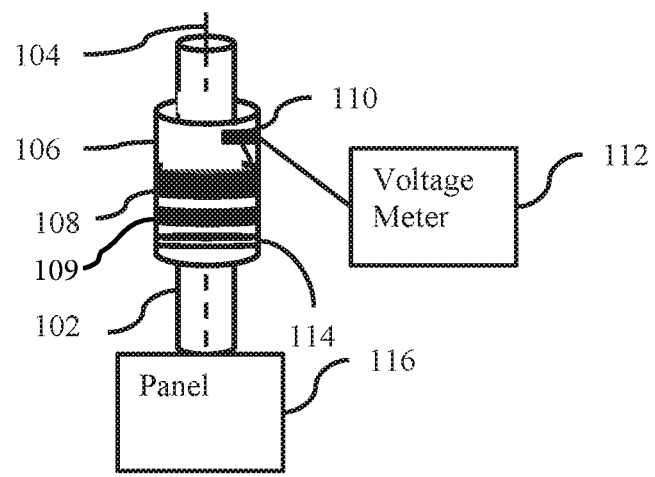
FIG. 1 illustrates an exemplary embodiment of a system for isolated capacitance voltage sensing.

FIG. 1 shows one embodiment of a system for isolated capacitance line voltage sensing. The system includes a powered wire 102 with a conductor 104 connected with a panel 116, such as a mains disconnect panel. A sleeve 106 with a conductor 108 and impedance transform circuit 110 is held by a clamp 114 around the powered wire 102. A voltage meter 112 may connect with an output of the impedance transform circuit 110.

Additional, different, or fewer components may be provided. For example, the impedance transform circuit 110 is not provided and the voltage meter connects directly to or indirectly through other circuits to the conductor 108 of the sleeve 106. As another example, the clamp 114 is not provided. The powered wire 102 may connect to other components than the panel 116. In yet another example, just the sleeve 106 and components on the sleeve 106 are provided.

The powered wire 102 is a wire from an electrical distribution grid into a facility. The voltage may nominally be about 120, 277, or other voltage. "About" for the voltage level is used to account for variance in the voltage due to supply variation and/or variation from adding and removing loads. The frequency of the supplied current is nominally 50 or 60 Hz. The powered wire 102 is one of three-phase wires, but could be one or all conductors in a single or polyphase power distribution system. In other embodiments, the powered wire 102 is a wire feeding one or more components within a facility (e.g., refrigerator or HVAC). Any powered wire 102 in a manufacturing, commercial, industrial, or residential setting may be used.

The powered wire 102 includes the internal conductor 104 and a coating of insulation. Any insulation may be used, such as rubber, plastic, glass, or paper.

The panel 116 is a mains disconnect panel, breaker box, or other panel for distributing supplied power to one or more components. The panel 116 may not be provided.

The sleeve 106 without the powered wire 102, panel 116, and/or voltage meter 112 is an apparatus for isolated capacitance line voltage sensing. In one embodiment, the apparatus is the sleeve 106 with an on-board conditioner (impedance transformation-impedance transform circuit 110) to provide a scaled AC signal to the downstream buffer and/or digitizer board of the power or voltage meter 112.

The sleeve 106 is a wrap, such as a flexible sheet of material. In one embodiment, the sleeve 106 is formed from flexible circuit material, such as a polyimide, polyester, or other electrically insulating material. For example, the sleeve 106 is formed from KAPTON. In other embodiments, the sleeve 106 is a hard or solid material. A hinge may allow for positioning around a greater extent of the circumference of the powered wire 102. Semi-rigid, rigid, and/or flexible materials may be used.

The sleeve 106 surrounds a circumference of the powered wire 102. Alternatively, the sleeve 106 wraps around only a portion of the powered wire 102. The sleeve 106 may rest against the powered wired 102 only along a portion of the circumference. By wrapping around a greater extent of the circumference, a higher value of capacitance may be attained.

In one embodiment, the sleeve 106 includes a connector for connecting two ends or edges together to surround the powered wire 102. A zipper, VELCRO, glue, tape, connector strip, or other material connects the edges together. A latch or snap fit may be used. In other embodiments, the edges do not connect together and may not even meet. Instead, the clamp 114 holds the sleeve 106 against the insulation of the powered wire 102.

When installing on an already powered and used powered line 102, the sleeve 106 is configured to rest against the insulation of the powered line 102 (i.e., against the insulation surrounding the conductor 104). The sleeve 106 is sized to fit around the powered wire 102, such as one size of the sleeve 106 for wrapping around a range of various wire sizes. The sizing avoids air or other material being between the sleeve 106 and the insulation.

In FIG. 1, the sleeve 106 is shown as cylindrical about a straight powered wire 102 along a length. The sleeve 106 may have any length, such as being one or more centimeters or inches in length (e.g., 1-20 centimeters). Where the powered wire 102 curves along the length of the powered wire 102, a whole cylindrical sleeve 106 may not wrap the powered wire 102 well. The sleeve 106 may include cut-outs, be formed from "finger" shapes, or have a pattern to rest against the insulation along the curvature. For example, the sleeve 106 is generally cylindrical, but is formed from pairs of diamond shapes connected together at the points to allow for hinging or bending with little wrinkling or distortion. Instead of flat or straight edges in a sheet, the sleeve 106 may have fingers or triangular ridges on the edges or over most of the wrap in order for the sleeve 106 to conform to variations in the insulation thickness and/or curvature of the powered wire 102.

The clamp 114 is a latch, twist tie, zip tie, rubber band, hose clamp, or other device for holding the sleeve 106 to the powered wire 102. While one clamp 114 is shown, more than one clamp 114 may be used. The clamp 114 is shown at one end, but may be positioned at any location along the length of the sleeve 106. The clamp 114 is separate from the sleeve 106, such as being positioned over the sleeve 106 after the sleeve 106 is positioned against the powered wire 102. Alternatively, the clamp 114 is integrated with or part of the sleeve 106. In other embodiments, the clamp 114 is not provided. Instead, the sleeve 106 itself holds the sleeve 106 to the powered wire 102, glue or bonding is used, or other connection is formed.

The clamp 114 applies pressure against the sleeve 106, causing the sleeve 106 to stay against the insulation of the powered wire 102. The pressure is provided along a circumference of the sleeve 106, but may be provided only at parts along the circumference. The clamp 114 acts to hold the sleeve against the insulation. Alternatively, the sleeve 106 is allowed to drape or loosely fits around the powered wire 102.

The sleeve 106 includes a conductive area 108. The conductive area 108 is a deposited metal, such as a metal sheet on flexible circuit material of the sleeve 106. A wire mesh, strands, electrodes, a wire, a trace, or other conductors may be used. For a flexible sleeve 106, the metal or film of the conductive area 108 is also flexible. The conductive area 108 is along any position of the sleeve 106, such as being along the entire length, in multiple parts, or only a portion.

In one embodiment, the conductive area 108 is a rectangular sheet, but other shapes may be used. For example, a 50 mm×100 mm conductive layer is formed on the sleeve 106. The conductive area 108 surrounds the powered wire 102, but may extend only along a portion of the circumference of the powered wire 102. Where the sleeve 106 has a shape for conforming to bends in the powered wire 102, the conductive area 108 may have a similar shape or pattern.

The conductive area 108 is on an inside of the sleeve 106 for positioning against the insulation of the powered wire 102 without any intervening material. In other embodiments, a layer of sleeve material intervenes, such as where the conductive area 108 is on an outside of the sleeve 106 or is formed as an interior layer of a multi-layer sleeve 106.

The conductive area 108, as positioned against or by (e.g., within a few millimeters) the powered wire 102, is a plate of a capacitor. The sleeve 106 provides the conductive area 108 as one plate of a capacitor where the other plate is formed by the conductor 104 of the powered wire 102 (see FIG. 2). The insulation 222 of the powered wire 102 and any other intervening materials or air acts as a dielectric for the capacitor. In one embodiment, a 50 mm×100 mm conductive area wrapping entirely around the circumference of a mains powered wire 102 has about 10 pf of capacitive coupling to the conductor 104. Other amounts of capacitive coupling may be provided by using a greater or smaller conductive area.

The impedance transform circuit 110 electrically connects with the conductive area 108. The capacitor formed by the conductive area 108 has a high impedance. The impedance is sufficiently high that the input impedance of the voltage meter 112, loads the circuit resulting in an inaccurate measurement. Instead, the impedance transform circuit 110 provides an impedance transformation between the higher impedance of the sleeve and the lower impedance of the meter.

The impedance transform circuit 110 is on or in the sleeve 106. Where the sleeve 106 is formed of flexible circuit material, the impedance transform circuit 110 is a flexible circuit formed on the same substrate as the conductive area 108 and the sleeve 106. In other embodiments, the impedance transform circuit 110 is one or more discrete components connected to or integrated with the sleeve 106.

Any circuit for transforming from a higher to a lower impedance may be used. In one embodiment, the impedance transform circuit 110 is one or more field effect transistors (FETs), such as a metal oxide semiconductor FET (MOSFET). For example, the FET is connected in a source follower configuration. The gate of the FET connects to the conductive area 108. The drain is connectable through a wire, transformer, or other connector to a direct current (DC) voltage source. The DC voltage source may be from the conductor 104 of the powered wire (e.g., transformer/rectifier circuit on the sleeve 106), the voltage meter 112, or other source. The source terminal of the FET is an output of an alternating current (AC) signal representing the electric field from the power of the powered wire 102. This source follower stage is formed on or connected with the flex circuit sleeve 106, providing an impedance transformation without much added noise. Using semiconductor production technology, the FET circuit may be fabricated on the substrate forming the sleeve 106. Other connections or arrangements may be used.

The impedance transformation circuit 110 has an AC signal output. The AC signal output has a linear relationship with the AC voltage of the powered wire 102. The AC voltage on the wire 102 causes an electric field around the wire. The capacitor responds to the variation of the electric field, generating an AC signal. The impedance transformation circuit 110 passes this AC signal at a lower impedance. The AC signal is proportional to the voltage of the powered wire 102, allowing measurement of the voltage by the voltage meter 112.

Figure 2:
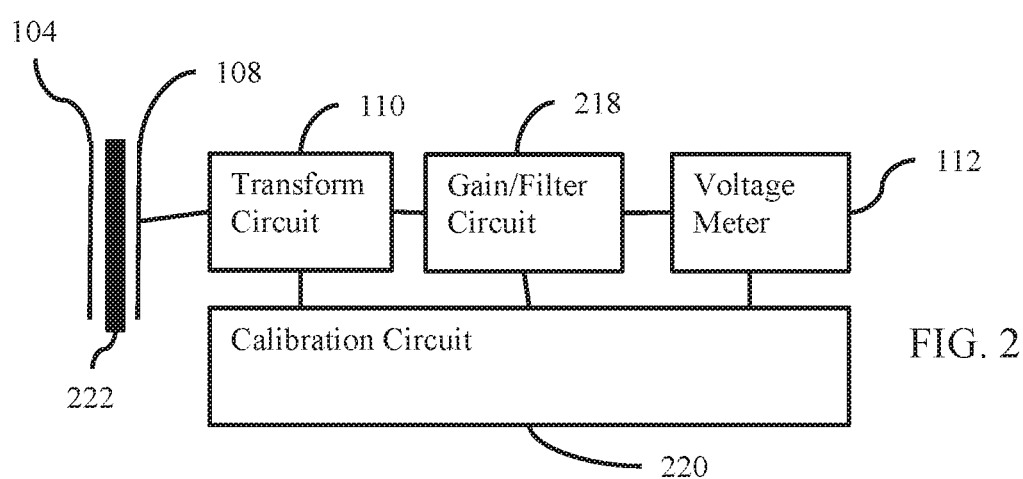
FIG. 2 is a block diagram of one embodiment of a circuit for isolated capacitance voltage sensing.

Referring to FIG. 2, other circuits may be provided. FIG. 2 shows a gain, buffer, filter circuit 218 and a calibration circuit 220. Any or none of the circuits 110, 218, and/or 220 are integrated with the sleeve 106. For example, all or parts of one or more of the circuits 110, 218, 220 are components on or in the sleeve 106. In other embodiments, none of the circuits 110, 218, 220 are on or in the sleeve 106, but are instead provided on one or more separate boards. In one alternative, parts or all of one or more of the circuits 110, 218, 220 are in the voltage meter 112 or on another board. For example, the impedance transformation circuit 110 is integrated with the sleeve 106 with the gain, buffer, and filter circuit 218, but the calibration circuit 220 is part of the voltage meter 112.

The gain, buffer, filter circuit 218 is a single circuit for performing amplification, buffering, and filtering. Alternatively, separate circuits are provided for each function. The gain and buffering is implemented with one or more operational amplifiers. The filtering is implemented with a combination of capacitors and resistors. In one embodiment, the operational amplifier includes resistors and capacitors connected to the input and outputs to provide gain, buffering, and filtering in one circuit. The gain, buffer, filter circuit 218 receives the AC signal prior to or as output by the impedance transformation circuit 110. The AC signal output to the voltage meter 112 has an amplitude determined by the gain circuit and with reduced out-of-band noise provided by the filter circuit. The voltage input to an energy meter, such as is represented by the voltage meter 112, receives the AC signal directly or indirectly from the gain, buffer, filter circuit 218.

The calibration circuit 220 is one or more resistors, capacitors, inductors, transistors, or combinations thereof. In one embodiment, the calibration circuit 220 is a variable or programmable resistor in a feed-back of an operational amplifier or other gain control. The calibration circuit 220 alters the amplitude of the AC signal output by the impedance transformation circuit 110 and/or the filter, buffer, gain circuit 218. The calibration circuit 220 adjusts the amplitude of the AC signal based on a reference. The reference is used to set an amount of deviation from expected so that the resulting voltage measurement represents the actual voltage. In other embodiments, the calibration circuit may inject a test stimulus voltage of known amplitude and frequency into the conductive area 108 and measure the resultant output of the transform circuit versus a reference. The error would then be used to adjust the gain of circuit 218 such that the expected output represents the actual voltage on powered wire 104. Implementation of the calibration circuit may use analog or mixed-signals and may include a micro-controller.

The calibration implemented by the calibration circuit 220 is manual or automatic. For manual, a dip switch or other manually adjustable resistance is provided. Based on a measured voltage using a probe at the panel 116 during installation of the sleeve 106, the resistance is varied until the AC signal is at the desired level proportional to the actual voltage of the powered line. For example, one dipswitch is provided for selecting between 120, 277, and 347 volts. An additional dipswitch or dipswitches are used to trim the selected voltage in any size increments, such as in 1 volt increments, over any range, such as a +/−16 $V_{ac}$ range. The manual calibration, assuming no human error, may be initially correct, but may drift over time unless the calibration is performed again.

In another embodiment, the calibration circuit 220 is automated. The conductive area 108 or another conductive area 109 of known size on the sleeve 106 connects with a signal source. The signal source generates a signal at a predetermined and known voltage with a predetermined and known frequency. The predetermined frequency is different than the frequency of the voltage on the powered line 102. The voltage meter 112 or other measurement circuit is used to measure a characteristic of the capacitance formed between the conductive area and the conductor of the powered line based on the response to the applied signal. Filtering is used to isolate the measurement to the applied signal rather than the power on the powered wire 102. Any characteristic of the capacitance may be measured, such as a dielectric constant. The dielectric constant is used to alter the gain of circuit 218 such that the measured voltage equals the actual voltage on wire 102.

Another circuit that includes a stimulation source that couples into the sleeve 106 and conductor area 108 may be used. Alternatively, the signal source is provided by the voltage meter 112 or other device, and the calibration circuit 220 performs the measurement for setting the gain applied to the AC signal for automatic calibration. Automatic calibration may assure accuracy for initial installation as well as compensation for drift over time.

The voltage meter 112 is part of a power meter or is a standalone voltage meter. In one embodiment, the voltage meter 112 is a standard or off-the-shelf part for measuring or metering voltage on mains power. Rather than requiring a high impedance input, the voltage meter 112 may measure the voltage with a low impedance input due to the impedance transformation circuit 110.

In one embodiment, the voltage meter 112 includes a DC output for powering the impedance transformation circuit 110. Other alterations may be provided for the voltage meter 112 to operate with the isolated capacitive line voltage sensor. For example, the calibration or part of the calibration circuit is included in the voltage meter 112. Alternatively, the voltage meter 112 receives a calibration setting and alters the measurement accordingly. The gain, filter, buffer circuit 218 may be included in the voltage meter 112. In yet another embodiment, the impedance transform circuit 110 is partly or entirely in the voltage meter 112.

The voltage meter 112 connects through one or more circuit elements to the sleeve 106. Wire nut, ring lug, or another connector may be used to hold the feeds to the pads, wires, or other output of the sleeve 106. For measuring voltage, the feed is connectable with the AC signal output. The voltage meter 112 may be meters away from the sleeve 106, may be positioned in the panel 116, or may be positioned in a different room than the sleeve 106.

Based on the AC signal output from the sleeve 106, the voltage meter 112 measures an amplitude of the signal. A peak or root mean square value may be measured. The AC signal is proportional to the AC signal on the conductor 104 of the powered wire 102, so the voltage of the AC signal on the powered wire 102 may be measured by determining the signal output from the sleeve 106.

Figure 3:
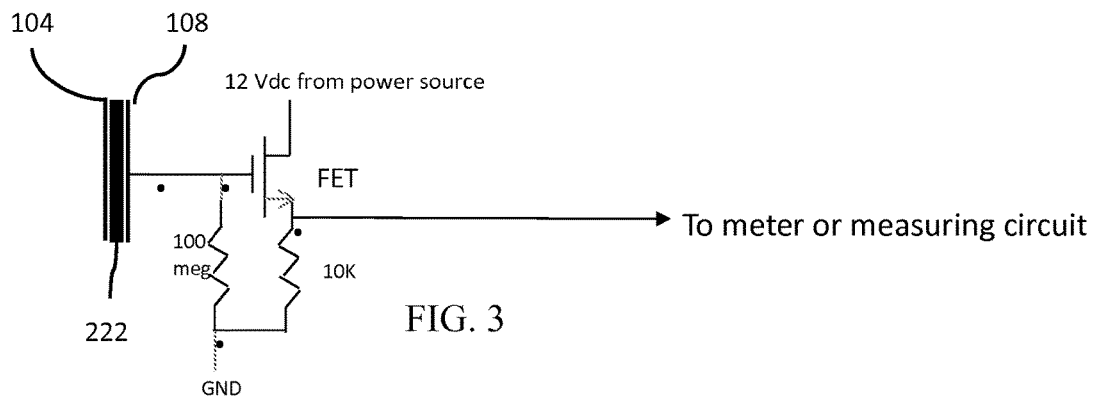
FIG. 3 is a circuit diagram of one embodiment of an isolated capacitance voltage sensor.

FIG. 3 shows an example circuit diagram of the isolated capacitance line voltage sensor, such as the transform circuit 110 of FIG. 1. The resistor values shown in FIG. 3 are approximate. A field effect transistor (FET) is used, but other transistors may be used. A 12 volt DC power is shown, but other powers may be used. Other values may be used. Other circuit arrangements may be used.

Figure 4:
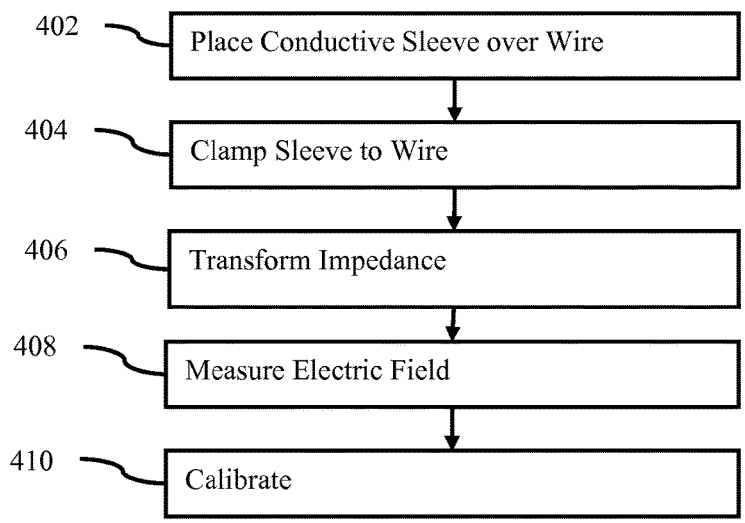
FIG. 4 is a flow chart diagram of one embodiment of a method for isolated capacitance voltage sensing.

FIG. 4 shows one embodiment of a method for isolated capacitance voltage sensing. The method is implemented by or with the system or apparatus of FIG. 1 or 2 or a different system or apparatus. For example, an installer performs acts 402 and 404 for installing the circuit, while the installed circuit performs acts 406 and 408. A user or installer may activate performance of acts 406 and 408. Act 410 is performed by a circuit and/or installer.

Additional, different, or fewer acts may be performed. For example, the clamping of act 404 is not performed. As another example, the calibration of act 410 is not performed. In yet another example, the impedance transform of act 406 is not performed. Other acts may include placing a current transformer and measuring a current, and removing the sleeve upon completion of monitoring or metering the voltage.

The acts are performed in the order shown or a different order. For example, the calibration of act 410 is performed in conjunction with acts 406 and 408 initially, and then acts 406 and 408 are repeated after calibration.

In act 402, an added conductor (e.g., conductor 108 of FIG. 1) is placed against electrical insulation material (e.g., insulation 222 of FIG. 2) of a power wire (e.g., power wire 102 of FIG. 1) while power is supplied through a conductor (e.g., power conductor 104) of the power wire, but without the added conductor being connected to the same power of the signal source. Rather than placing the added conductor over, on, or beside the power wire during installation of a distribution panel and/or initial connection of the power wire to the panel, the conductor is placed for an existing or previously installed power wire. The power wire is, at the time of placement of the conductor, used to supply power to or from the panel and/or other device. For example, the placement occurs with the power wire already connected to the disconnect panel. Alternatively, the conductor is placed during installation of the power wire or other time when there is no power in the power wire and/or the power wire is not connected to the panel or other device.

The added conductor is placed by positioning relative to the power wire. The added conductor is placed into contact with insulation material covering an internal conductor of the power wire. In one embodiment, the conductor is flexible, such as being metal deposited or formed on flexible circuit material. The flexible conductor is wrapped around at least a portion (e.g., at least half) of a circumference of the power wire. The insulation material is surrounded, at least partially, with the sheet of flexible material forming the conductor. This placement positions the conductor against the insulation material of the power wire. Intervening materials may be included between the conductor and the power wire.

After the installer has placed the sleeve or other material with the added conductor on the power wire, the added conductor or supporting material is clamped to the wire in act 404. The installer positions one or more clamps around the sleeve, added conductor, or supporting material. The clamp is then tightened or adjusted to hold the added conductor against or beside the electrical insulation of the power wire. Alternatively, the clamp is integrated with the added conductor or supporting material so that placement of the conductor places the clamp. The installer then tightens or fastens the clamp to hold the conductor relative to the power wire.

The clamp may be fixed or not releasable. For example, a zip tie is used to clamp. In an alternative embodiment, the clamp is releasable. The installer may attach the clamp, and remove the clamp when the use of the conductor is finished. The clamp is released to uninstall. For example, a hose clamp is unscrewed to release the clamp and remove the conductor.

Once positioned, the added conductor forms a capacitor with the conductor of the power wire functioning as another plate of the capacitor and the insulation of the power wire as a dielectric of the capacitor. Due to the variation in the amplitude of the signal on the power wire, the electric field around the power wire varies. This variation results in an AC signal on the conductor due to the capacitive coupling to the conductor of the power wire when the AC signal is present on the conductor of the power wire. The amplitude of the AC signal on the conductor is proportional to the amplitude of the AC signal on the power wire.

In act 406, an impedance is transformed. The capacitor formed, in part, by the added conductor separated from the conductor of the power wire by the insulation has a high impedance. To reduce the impedance for operation of circuits and/or voltage measurement, the impedance is transformed. The AC signal from the added conductor placed against the power wire is input to the transformation circuit (e.g., transform circuit 110 of FIG. 1). For example, the AC signal is input to a gate of a field effect transistor as shown in FIG. 3. The transformation circuit outputs the AC signal or a proportional AC signal with a lower impedance. For example, the source terminal of the field effect transistor, such as shown in FIGS. 2 and 3, is used as the output. The drain of the field effect transistor is provided an operating voltage (e.g., DC voltage), such as 12 volts. The impedance of the source is lower than the impedance of the capacitor formed by the added conductor, insulation material, and internal conductor of the power wire.

By incorporating the impedance transformation into the conductor or supporting material placed against the power wire, existing or standard voltage meters may be used to measure the voltage. A conversion of the measured voltage to an actual voltage or a specific configuration of the voltage meter may be used to account for the isolated capacitance voltage sensing using the electric field instead of direct metal-to-metal contact.

In act 408, the voltage of the power wire is measured. The measurement occurs periodically, when triggered, or continuously.

The voltage is measured based on the capacitance between the conductor and the power wire. The measurement is of the signal present on the added conductor resulting from the electric field caused by the power supplied in the power wire when the added conductor is positioned on or relative to the power wire, such that the measurement is proportional to the voltage in the power wire.

To measure, a voltage meter (e.g., voltage meter 112) or feed of a voltage meter is connected to the added conductor. The connection is direct or indirect. For example, the impedance transformation circuit intervenes to create an indirect connection. The voltage meter is configured to measure the voltage of the signal present on the conductor of the power wire as if a direct metal-to-metal connection were formed. Further processing may be provided to convert the measured voltage to an actual voltage present on the power line. Alternatively, the voltage meter is configured to measure the voltage based on the electric field measurement, so converts the measured signal amplitude using a linear or non-linear relationship to the actual voltage.

In act 410, the isolated capacitance voltage sensor is calibrated. The calibration adjusts the gain or other conversion function of the circuitry (e.g., transform circuit 110 of FIG. 2) of the sleeve, of the voltage meter reading the voltage from the sleeve, and/or of a processor using or processing the voltage output by the voltage meter.

The calibration matches a voltage of the AC signal from or at the sleeve to a reference voltage. For example, a voltage probe is used to measure the actual voltage of the powered wire at the time of installation. At a same time or within a few minutes, a voltage reading using the sleeve is performed. A gain applied to the voltage from the sleeve or capacitor defined by the added conductor, the insulation, and the interior conductor of the power wire is increased or decreased to match the voltages or provide a desired difference. Alternatively, a mapping function is selected or provided based on an amount of error (e.g., processor implemented look-up table is selected from different optional tables).

In another embodiment, a dielectric characteristic of the capacitance created by the added conductor with the conductor of the power wire is measured. A pre-determined voltage at a pre-determined frequency is applied as a signal to the capacitive plate of the sleeve while the power wire is powered. The frequency is different than the frequency of the power signal on the power wire. The reaction of the capacitor to the applied signal at the pre-determined frequency is measured, such as measuring a phase shift, voltage amplitude, and/or decay in the signal at the frequency with the voltage meter. The measured information is used to calculate the dielectric constant, calculate a capacitive coupling, or is used itself as a dielectric characteristic. Using a look-up table or function, the actual voltage is derived from a measured voltage and the dielectric characteristic. The measuring compensates for the dielectric characteristic of the capacitance. Other calibration approaches may be used.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

What is claimed is:

1. A method for isolated capacitance line voltage sensing, the method comprising:
   placing a multi-layer sleeve comprising flexible circuit material, a first added conductor and a second added conductor against electrical insulation material of a power wire while power is present on a power conductor of the power wire, the power wire connected with a disconnect panel, wherein at least one of the first and second added conductors is formed as an interior layer of the multi-layer sleeve;
   transforming an impedance of a capacitor formed by the first added conductor and the power wire to a lower impedance using an impedance transform circuit, wherein the impedance transform circuit is a flexible circuit on or in the multi-layer sleeve,
   measuring a capacitance characteristic between the second added conductor and the power conductor in response to a pre-determined voltage and a pre-determined frequency signal applied to the second added conductor that is different than a frequency of the power; and
   measuring a voltage of the power as a function of a capacitance between the first added conductor and the power conductor and as a function of the measured capacitance characteristic for the pre-determined voltage and the pre-determined frequency signal, including adjusting the measured voltage based on the measured capacitance characteristic of the applied signal so that the measured voltage corresponds to an actual voltage of the power on the power wire.

2. The method of claim 1 wherein placing comprises wrapping the flexible circuit material around a portion of a circumference of the insulation material of the power wire, the first added conductor comprising a metal deposited on the flexible circuit material.

3. The method of claim 1 wherein placing comprises surrounding the insulation material with the first added conductor, the first added conductor comprising a sheet of flexible material.

4. The method of claim 1 further comprising releasably clamping the first added conductor against the electrical insulation.

5. The method of claim 1 wherein measuring comprises connecting a voltage meter to the first added conductor.

6. The method of claim 1 wherein measuring comprises measuring an electric field of the power supplied in the power wire.

7. The method of claim 1 wherein measuring comprises measuring with a voltage meter configured to operate with the lower impedance.

8. The method of claim 7 wherein transforming comprises transforming with a field effect transistor.

9. The method of claim 8 wherein the field effect transistor and the first added conductor are part of a flexible circuit, a gate of the field effect transistor connects to the first added conductor, a source of the field effect transistor connects for the measuring, and a drain of the field effect transistor connects to a direct current voltage source.

10. The method of claim 1 wherein the measured capacitance characteristic for the pre-determined voltage and the pre-determined frequency signal includes a dielectric characteristic of the capacitance.

11. A system for isolated capacitance line voltage sensing, the system comprising:
    a multi-layer sleeve comprising flexible circuit material sized to wrap around at least part of an insulated wire;
    a first conductive area formed as an interior layer of the multi-layer sleeve;
    an impedance transform circuit connected with the first conductive area, wherein the impedance transform circuit is a flexible circuit on or in the multi-layer sleeve, and wherein the impedance transform circuit has an AC signal output;
    a calibration circuit on the sleeve, wherein the calibration circuit comprises a second conductive area disposed on the sleeve, the second conductive area connectable with an applied signal at a predetermined voltage at a predetermined frequency different than a frequency of a power on the insulated wire; and
    a measurement circuit configured to measure a capacitance characteristic between the second conductive area and the insulated wire when the second conductive area is connected to the predetermined voltage at the predetermined frequency, wherein the AC signal output is adjusted based on the measured capacitance characteristic of the applied signal so that the AC signal output represents a measure of an actual voltage of the power on the insulated wire other than the predetermined voltage.

12. The system of claim 11 wherein the sleeve comprises a sheet of flexible circuit material, and wherein the first conductive area of the sleeve comprises a metal sheet disposed on the sheet of flexible circuit material.

13. The system of claim 11 wherein the first conductive area comprises interconnected sections of flexible conductor such that the first conductive area wraps around the insulated wire where the insulated wire is curved along a length.

14. The system of claim 11 wherein the impedance transform circuit comprises a field effect transistor with a gate connected with the first conductive area, a drain connectable with a direct current voltage source, and a source defining the AC signal output.

15. The system of claim 11 further comprising a gain circuit, a buffer circuit, a filter circuit, or combinations thereof on the sleeve and connected with the AC signal output.

16. The system of claim 11, wherein the measurement circuit is included on the sleeve, further comprising the predetermined voltage at a predetermined frequency connected to the second conductive area, wherein the AC signal output is based at least in part on the capacitance characteristic measured by the measurement circuit.

17. The system of claim 16 wherein the capacitance characteristic between the second conductive area and the insulated wire includes a dielectric constant.

18. The system of claim 11 further comprising a voltage meter connectable with the AC signal output, the voltage meter having an impedance matched to the AC signal output, having a voltage source connectable with the impedance transform circuit, providing the predetermined voltage at a predetermined frequency connected to the second conductive area, and having the measurement circuit that is configured to measure a capacitance characteristic between the second conductive area and the insulated wire, wherein the voltage meter is configured to output a measurement corresponding to a voltage of the insulated wire based on both the AC signal output and the capacitance characteristic measured by the measurement circuit.

19. The system of claim 11 further comprising a clamp configured to hold the sleeve against the insulated wire.

\* \* \* \* \*